(12) United States Patent
Yasotharan et al.

(10) Patent No.: US 12,308,850 B2
(45) Date of Patent: May 20, 2025

(54) LOW JITTER CLOCK MULTIPLIER CIRCUIT AND METHOD WITH ARBITRARY FREQUENCY ACQUISITION

(71) Applicant: Cadence Design Systems, Inc., San Jose, CA (US)

(72) Inventors: Hemesh Yasotharan, Toronto (CA); Navid Yaghini, Pickering (CA); Zhuobin Li, Markham (CA); Clifford Ting, Toronto (CA); Robert Wang, Toronto (CA)

(73) Assignee: Cadence Design Systems, Inc., San Jose, CA (US)

( * ) Notice: Subject to any disclaimer, the term of this patent is extended or adjusted under 35 U.S.C. 154(b) by 215 days.

(21) Appl. No.: 18/254,522

(22) PCT Filed: Nov. 25, 2021

(86) PCT No.: PCT/US2021/060884
§ 371 (c)(1),
(2) Date: May 25, 2023

(87) PCT Pub. No.: WO2022/115650
PCT Pub. Date: Jun. 2, 2022

(65) Prior Publication Data
US 2024/0106444 A1 Mar. 28, 2024

Related U.S. Application Data

(60) Provisional application No. 63/118,714, filed on Nov. 26, 2020.

(51) Int. Cl.
*H03L 7/183* (2006.01)
*H03L 7/081* (2006.01)

(52) U.S. Cl.
CPC ............ *H03L 7/183* (2013.01); *H03L 7/0818* (2013.01)

(58) Field of Classification Search
CPC .............................. H03L 7/183; H03L 7/0818
See application file for complete search history.

(56) References Cited

U.S. PATENT DOCUMENTS 5,783,959 A * 7/1998 Yokoyama ....... G01R 31/31922
327/156
9,362,936 B1 * 6/2016 Caffee .................... H03K 5/135
(Continued)

FOREIGN PATENT DOCUMENTS

WO WO-2022115650 A1 * 6/2022 ......... H03K 5/00006

OTHER PUBLICATIONS

Farjad-Rad, Ramin et al., "A Low-Power Multiplying DLL for Low-Jitter Multigigahertz Clock Generation in Highly Integrated Digital Chips", IEEE Journal of Solid-State Circuits, vol. 37, No. 12, Dec. 2002, pp. 1804-1812. 9 pages.
(Continued)

*Primary Examiner* — Adam D Houston
(74) *Attorney, Agent, or Firm* — Mark H. Whittenberger; Holland & Knight LLP

(57) ABSTRACT

A circuit and method are described for generating a low jitter output clock having an arbitrary non-integer divide ratio relative to a high-frequency clock. Integer divide ratios of the high-frequency clock may be achieved by dividing the high-frequency clock by the reference clock and phase locking the output clock to the high-frequency clock. Non-integer divide ratios can be achieved by dividing the high-frequency clock by the nearest integer, rounded down, and then delaying the resultant output clock by the modulus of the division. The delay can then be rotated across to create a clock with a non-integer divide ratio relative to the
(Continued)

high-frequency clock. By doing so, a high-frequency clock may be used that is not constrained by having a frequency that is an integer multiple of each desired component-specific output clock signal.

12 Claims, 5 Drawing Sheets

(56) References Cited

U.S. PATENT DOCUMENTS

| | | | |
|---|---|---|---|
| 11,271,584 B2* | 3/2022 | Choi | H03K 5/131 |
| 11,296,710 B2* | 4/2022 | Roodnat | H03L 7/0991 |
| 11,418,199 B1* | 8/2022 | Cherniak | H03L 7/087 |
| 11,632,116 B2* | 4/2023 | Perrott | H03L 7/087 327/156 |
| 11,909,405 B1* | 2/2024 | Grimaldi | H03L 7/085 |
| 11,909,409 B1* | 2/2024 | Jain | H03L 7/0891 |
| 12,063,044 B2* | 8/2024 | Lee | H03L 7/0991 |
| 12,143,114 B2* | 11/2024 | Mukherjee | H03M 1/0604 |
| 2004/0113668 A1 | 6/2004 | Gaskins et al. | |
| 2008/0079502 A1* | 4/2008 | Huang | H03L 7/0992 331/16 |
| 2010/0214025 A1* | 8/2010 | Chen | H03L 7/183 331/8 |
| 2010/0308880 A1* | 12/2010 | Wang | H03L 7/0807 327/163 |
| 2015/0091617 A1 | 4/2015 | Zerbe et al. | |
| 2016/0026208 A1 | 1/2016 | Koh | |
| 2016/0233871 A1 | 8/2016 | Zerbe et al. | |
| 2016/0373120 A1* | 12/2016 | Caffee | H03L 7/0891 |
| 2019/0222217 A1 | 7/2019 | Zerbe et al. | |
| 2020/0106430 A1* | 4/2020 | Martin | H03L 7/0816 |
| 2021/0013893 A1* | 1/2021 | Gailhard | H03L 7/099 |
| 2022/0173740 A1* | 6/2022 | Van Elzakker | H03L 1/02 |
| 2023/0013600 A1* | 1/2023 | Tsai | H03L 7/0995 |
| 2024/0030927 A1* | 1/2024 | Belz | H03L 7/08 |
| 2024/0056084 A1* | 2/2024 | Lee | H03L 7/093 |
| 2024/0223193 A1* | 7/2024 | Wu | H03L 7/095 |

OTHER PUBLICATIONS

Notification of Transmittal of the International Search Report and the Written Opinion of the International Searching Authority, or the Declaration with Mail Date Feb. 17, 2022 re: Int'l Appln. No. PCT/US2021/060884. 8 pages.

* cited by examiner

LOW JITTER CLOCK MULTIPLIER CIRCUIT AND METHOD WITH ARBITRARY FREQUENCY ACQUISITION

FIELD

The present disclosure relates to clock generation for integrated circuits. In particular, it relates to circuits and methods for generating a low jitter clock for acquiring arbitrary clock frequencies.

BACKGROUND

In integrated circuit design and electronic system design, clock signals (also called simply "clocks") are used by the individual components or circuits of an overall circuit design to synchronize their operations. Different components may require clocks operating at different rates, which may be determined by the constraints on the operating speed of the operations of that component. Thus, an overall circuit design may need to supply multiple clock signals operating at different rates.

Typically, the generation of multiple clock signals is accomplished by providing a single reference clock from which further signals can be derived. The reference clock is typically a stable clock generated using a quartz crystal or other reliable, fixed-rate oscillator with a frequency that does not vary with environmental conditions such as temperature. The reference clock typically has a relatively low frequency (also called "rate" or "clock rate"). Additional clock signals operating at different (typically higher) frequencies may be derived from the reference clock by clock rate multiplication. The stability and consistency of the higher-frequency, component-specific clock signals can be maintained by synchronizing (also called "locking") the edges of each higher-frequency clock signal with those of the reference clock.

Thus, a typical approach to the generation of multiple clock signals with multiple different frequencies involves, first, generating a high-frequency clock having a frequency that is roughly a multiple of the clock rate of the reference clock. A clock divider (also called a frequency divider) is then used to generate a feedback clock signal having a frequency that is an integer division of the frequency of the high-frequency clock and that attempts to replicate the timing of the reference clock. Thus, if the high-frequency clock has a frequency f1, the clock divider may generate a feedback clock signal having a frequency of f1/k wherein k is an integer defining the clock division operation of the clock divider. The feedback clock can then be used to lock the edges of the high-speed clock to the edge timing of the reference clock, thereby maintaining the stability and consistency of the high-speed clock.

Difficulties arise, however, when a component requires a clock rate that is not an integer division of the frequency of the high-frequency clock. One existing approach to generating a clock having a non-integer divide ratio relative to the high-frequency clock is shown in the timing diagram of FIG. 1 (prior art). In order to achieve non-integer divide ratios, the clock divider alternates between two divide ratios such that the average divide ratio is equal to the desired ratio. For example, in FIG. 1 (prior art), the clock divider alternates equally between a divide ratio of 4 (Div 4) and a divide ratio of 5 (Div 5) to achieve a divide ratio of 4.5.

FIG. 1 (prior art) shows a timing diagram of an existing approach 100 to achieving non-integer clock divide ratios. A reference clock 102 is shown at the top, with a high-frequency clock 104 below it. This approach 100 attempts to lock the edges of an output clock to the edge timing of the reference clock 102 by generating a high-frequency clock 104, then dividing its frequency to generate a feedback clock signal 140, which is used to lock the edges of the high-speed clock 104 to those of the reference clock 102.

To generate a feedback clock signal having a divide ratio of 4.5 relative to the high-frequency clock 104, a clock divider is used to alternate alternates equally between a divide ratio of 4 (Div 4) and a divide ratio of 5 (Div 5), thereby generating a feedback clock signal 140. The clock divider first applies a divide ratio of 5 (Div 5) to the high-frequency clock 104 between time t1 122 and time t2 124 to generate a first Div 5 clock signal 106, which is used as a first portion of the feedback clock signal 140 between time t1 122 and time t2 124. After a falling clock edge of the first Div 5 clock signal 106, the clock divider applies a divide ratio of 4 (Div 4) to the high-frequency clock 104 between time t2 124 and time t3 128 to generate a first Div 4 clock signal 108, which is used as a second portion of the feedback clock signal 140 between time t2 124 and time t3 128. After a falling clock edge of the first Div 4 clock signal 108, the clock divider again applies a divide ratio of 5 (Div 5) to the high-frequency clock 104 between time t3 128 and time t4 132 to generate a second Div 5 clock signal 110, which is used as a third portion of the feedback clock signal 140 between time t3 128 and time t4 132. After a falling clock edge of the second Div 5 clock signal 106, the clock divider again applies a divide ratio of 4 (Div 4) to the high-frequency clock 104 between time t4 132 and time t5 136 to generate a second Div 4 clock signal 112, which is used as a fourth portion of the feedback clock signal 140 between time t4 132 and time t5 136. This alternation continues as long as an output clock signal is required to regulate the operation of a component.

Whereas FIG. 1 shows a divide ratio of 4.5, other fractional divide ratios are achievable using similar techniques in which the number of clock cycles spent in each integer divide ratio is a ratio other than 1:1. For example, a divide ratio of 4.4 might be achieved by constructing a feedback clock signal having, for each five clock cycles, three DIV 4 cycles and two DIV 5 cycles. Thus, for example, the clock cycles of a DIV 4.4 feedback clock signal could be constructed by using clock cycles following the pattern (DIV 4|DIV 5|DIV 4|DIV 5|DIV 4|DIV 4|DIV 5|DIV 4|DIV 5|DIV 4|DIV 4 . . . ). For any desired divide ratio k, the feedback clock would use t1 cycles of a DIV N signal and t2 cycles of a DIV M signal such that $k=(t1*N+t2*M)/(t1+t2)$.

As the feedback clock signal 140 is generated, it used to generate an output clock, which is used to regulate the operation of a component of the overall system.

The approach shown in FIG. 1 (prior art) has the disadvantage that the alternation between two divide ratios leads to a jittery feedback clock signal 140, as the output clock edges alternate between jumping ahead of those of the reference clock (e.g., at time t3 128) after each period at a high rate (i.e. Div 4), and then slowing down to let the reference clock "catch up" during each period at a slower rate (i.e. Div 5). The jitter in the feedback clock signal 140 leads to a corresponding amount of jitter in the desired output clock of the system. This jitter can have adverse effects on performance within the specific component governed by the output clock and throughout the overall system. A typical system using this approach may introduce jitter of approximately 1 picosecond root-mean-squared (RMS) jitter.

There thus exists a need for a circuit or method that can generate a clock having non-integer divide ratios relative to a high-frequency clock without introducing jitter.

SUMMARY

The present disclosure describes example circuits and methods for generating a low-jitter output clock having an arbitrary non-integer divide ratio relative to a high-frequency clock. Integer divide ratios of the high-frequency clock may be achieved by dividing the high-frequency clock by the reference clock and phase locking the output clock to the high-frequency clock. Non-integer divide ratios can be achieved by dividing the high-frequency clock by the nearest integer, rounded down, and then delaying the resultant output clock by the modulus of the division. The delay can then be rotated across to create a clock with a non-integer divide ratio relative to the high-frequency clock. By doing so, a high-frequency clock may be used that is not constrained by having a frequency that is an integer multiple of each desired component-specific output clock signal.

Thus, some embodiments described herein may remove the high-frequency clock as a constraint on system design. Output clocks may be generated whose jitter is equivalent to that of an integer mode clock multiplier. Therefore, no restriction is placed on the high-frequency clock to have a frequency that is an integer multiple of the desired output clock frequency. This may reduce the burden placed on system designers to use off-the-shelf and/or inexpensive high-frequency clock sources with good phase noise profiles. It may also enable designers to generate any output clock that is within the range of the output clock generation block.

In some examples, the embodiments described herein may result in an improvement in output jitter by a factor of 2 to 3 relative to existing approaches, due to the clock divider not alternating between two divide ratios. For example, alternating between a divide ratio of 66 and a divide ratio of 67 causes significant temporal displacement of the clock edges. By using variable skew control, the incremental change in a clock edge is much smaller, thus potentially allowing for better jitter performance in described embodiments. Thus, whereas conventional approaches may result in approximately 1 picosecond root-mean-squared (RMS) jitter, some embodiments described herein may reduce this jitter to approximately 300 femtoseconds RMS.

According to some aspects, the present disclosure describes a clock generation circuit for generating a clock signal at a desired frequency based on a high-frequency clock signal. The high-frequency clock signal has a frequency equal to the desired frequency multiplied by a frequency multiple. The clock generation circuit comprises a clock divider configured to apply a divide ratio to the high-frequency clock signal to generate a divided clock signal. The divide ratio is equal to the frequency multiple rounded up or down to an integer value. The clock generation circuit comprises a variable skew control block configured to apply a delay to the divided clock signal to generate a first portion of a feedback clock signal such that an edge of the first portion of the feedback clock is delayed to coincide with a corresponding edge of the high-frequency clock signal divided by the frequency multiple, and repeat one or more times a step of applying an additional delay to the divided clock signal to generate one or more additional portions of the feedback clock signal such that an edge of each additional portion of the feedback clock is delayed to coincide with a corresponding edge of the high-frequency clock signal divided by the frequency multiple.

According to some aspects, the present disclosure describes a method for generating a clock signal at a desired frequency. A high-frequency clock signal is received. The high-frequency clock signal has a frequency equal to the desired frequency multiplied by a frequency multiple. A clock divider is used to apply a divide ratio to the high-frequency clock signal to generate a divided clock signal. The divide ratio is equal to the frequency multiple rounded up or down to an integer value. A variable skew control block is used to apply a delay to the divided clock signal to generate a first portion of a feedback clock signal such that an edge of the first portion of the feedback clock is delayed to coincide with a corresponding edge of the high-frequency clock signal divided by the frequency multiple. The variable skew control block is used to repeat one or more times a step of applying an additional delay to the divided clock signal to generate one or more additional portions of the feedback clock signal such that an edge of each additional portion of the feedback clock is delayed to coincide with a corresponding edge of the high-frequency clock signal divided by the frequency multiple.

According to a further aspect which can be combined with other embodiments disclosed herein, the clock divider applies the divide ratio in response to receiving a clock divider control signal.

According to a further aspect which can be combined with other embodiments disclosed herein, the variable skew control block applies the delay and each additional delay in response to receiving variable skew control signals.

According to a further aspect which can be combined with other embodiments disclosed herein, the circuit further comprises a phase-locked-loop digital-to-time converter configured to compare the feedback clock signal to a reference clock signal, and a clock control unit configured to generate the clock divider control signal and variable skew control signals based on the comparison of the feedback clock signal to the reference clock signal.

According to a further aspect which can be combined with other embodiments disclosed herein, the phase-locked-loop digital-to-time converter compares the feedback clock signal to the reference clock signal by measuring a relative phase difference between the feedback clock signal and the reference clock signal, and the clock control unit is configured to receive the measured relative phase difference from the phase-locked-loop digital-to-time converter.

According to a further aspect which can be combined with other embodiments disclosed herein, the circuit further comprises a clock generator block configured to generate the high-frequency clock signal based on the relative phase difference between the feedback clock signal and the reference clock signal.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

The present disclosure describes example circuits and methods for generating a low-jitter output clock having an arbitrary non-integer divide ratio relative to a high-frequency clock. In embodiments disclosed herein, integer divide ratios of the high-frequency clock may be achieved by dividing the high-frequency clock by the reference clock and phase locking the output clock to the high-frequency clock. Non-integer divide ratios can be achieved by dividing the high-frequency clock by the nearest integer, rounded down, and then delaying the resultant output clock by the modulus of the division. The delay can then be rotated across to create a clock with a non-integer divide ratio relative to the high-frequency clock.

In embodiments described herein, a clock divider may be used to apply integer divide ratios to the high-frequency clock, and a variable skew control block may be used to apply a variable amount of delay to the divided clock generated by the clock divider.

Figure 1:
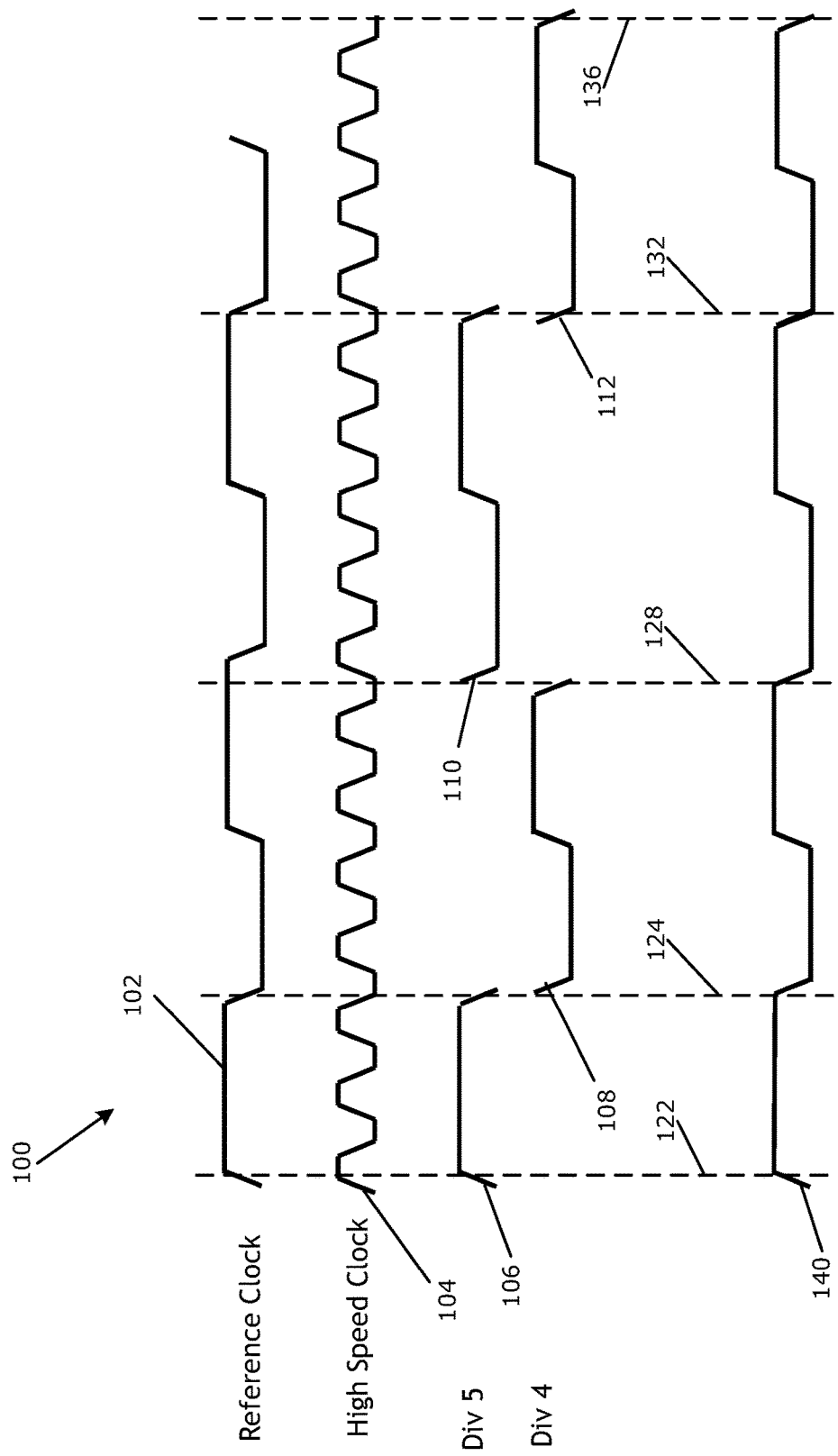
FIG. 1 (prior art) is a timing diagram showing a conventional clock signal generated by alternating between two clock divide ratios applied to a high speed to clock to approximate the timing of a reference clock.
Figure 2:
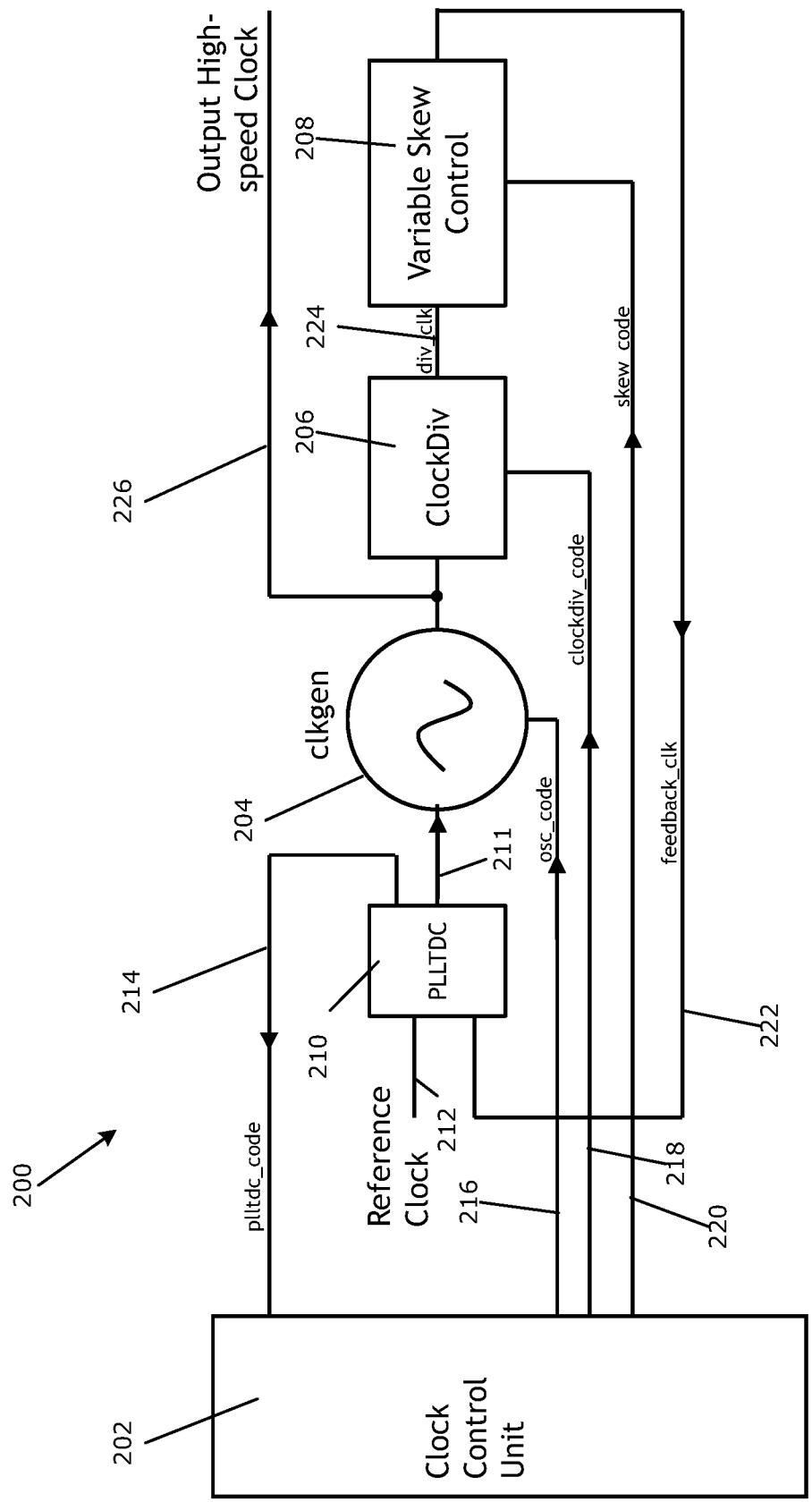
FIG. 2 is a block diagram showing an example clock generation circuit using a clock divider block and variable skew control block according to examples described herein.

FIG. 2 shows an example clock generation circuit 200 used to generate a low-jitter, high-frequency output clock 226 based on a reference clock 212. The reference clock 212 is received by the first block in the loop, the phase-locked-loop time-to-digital converter (PLL TDC, or PLLTDC) 210. The PLLTDC compares two incoming clocks (in this case, the reference clock 212 and a feedback clock 222 described below) and measures the relative phase difference φΔ of the two incoming clocks 212, 222. This measured phase difference φΔ is then sent as a phase difference signal 211 to a high-frequency oscillator 204. The measured phase difference φΔ is also sent as a PLLTDC output signal 214 to a clock control unit 202, which then adjusts the control registers of the remaining blocks in the loop 204, 206, 208 such that the phase difference φΔ is made zero, as described below.

The clock control unit 202 sends oscillator control signals 216 to the high-frequency oscillator 204, which outputs the high-frequency output clock 226, whose output frequency is a multiple of the reference clock (any arbitrary multiple, integer or non-integer, as described below). The phase difference signal 211 is used by the high-frequency oscillator 204 to adjust the frequency of the high-frequency output clock 226: if the feedback clock 222 is ahead of the reference clock 212, the high-frequency output clock 226 is slowed down, whereas if the feedback clock 222 is behind the reference clock 212, the high-frequency output clock 226 is sped up. The high-frequency output clock 226 is then divided down by a clock divider 206 based on clock divider control signals 218 received from the clock control unit 202 to generate a divided clock signal 224. The divided clock signal 224 is then delayed (i.e. skewed) such that its falling edge (or rising edge, in some examples) matches that of an ideal clock at the frequency of the reference clock 212, based on skew control signals 220 received from the clock control unit 202, to generate the feedback clock signal 222. The feedback clock signal 222 is sent as the second input to the PLLTDC.

Figure 3:
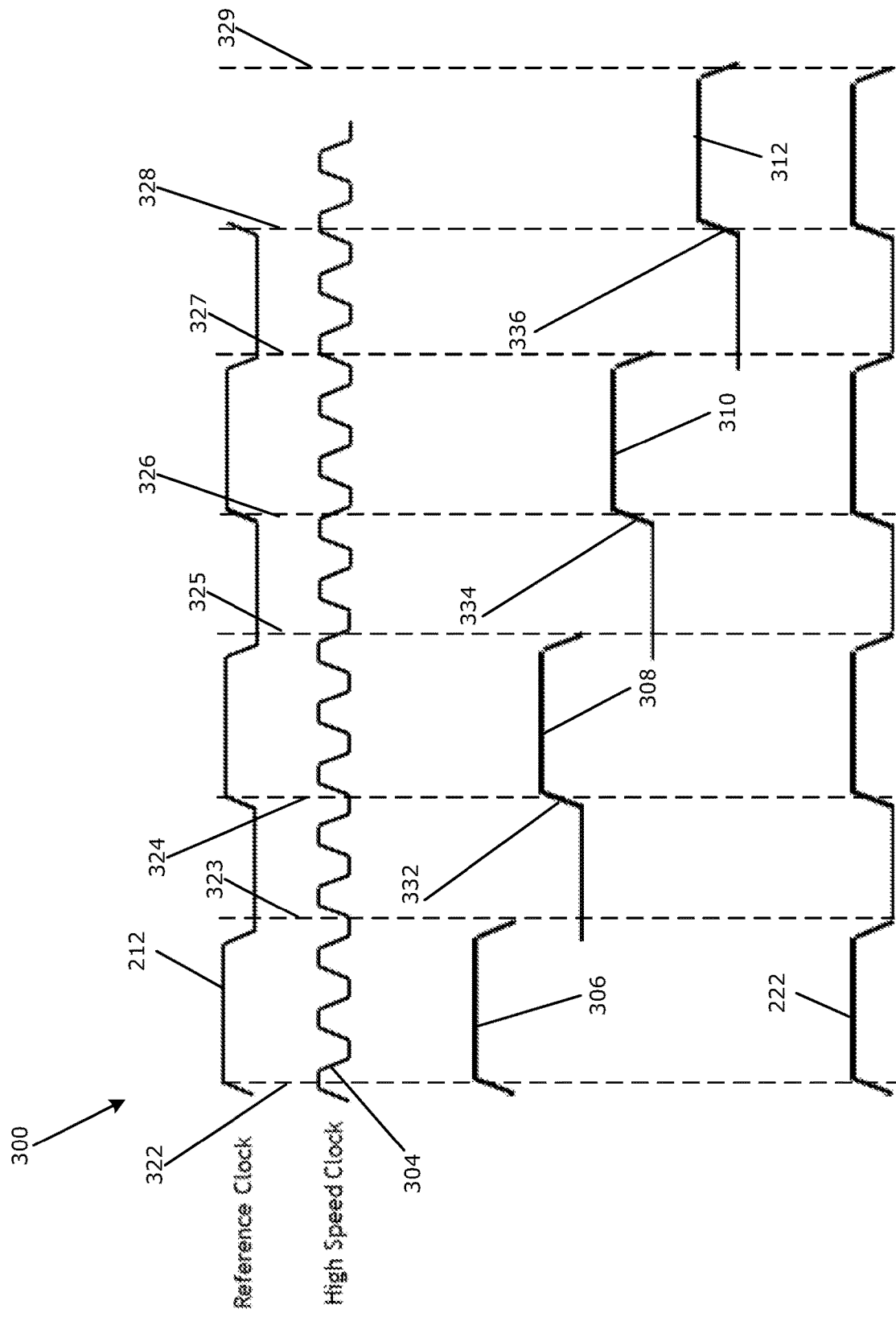
FIG. 3 is a timing diagram showing a clock signal generated by the circuit of FIG. 2 by using a single divide ratio and varying the skew of the clock signal to approximate the timing of a reference clock.

FIG. 3 is a timing diagram showing the generation of an example feedback clock 222 by the clock generation circuit 200 according to a first example embodiment 300, which may be used to generate a high frequency output clock 226 having an arbitrary frequency. The reference clock 212 is shown at the top, with a desynchronized high-frequency clock 304 shown below it. The desynchronized high-frequency clock 304 represents the high-frequency output clock 226 prior to adjustment of its frequency and phase as described below. Thus, for example, desynchronized high-frequency clock 304 corresponds to the output of the high-frequency oscillator 204 with the components of the feedback loop 206, 208, 210 disabled. In this example, the clock generation circuit 200 is configured to generate a feedback clock 222 that is a factor of 4.5 slower than the desynchronized high-frequency clock 304.

First, beginning at time t1 322, the clock divider 206 is operated (e.g., by the clock divider control signals 218 from the clock control unit 202) to divide the high-frequency output clock 226 by 4 (Div 4) to generate a first Div 4 clock signal 306, which is used as a first portion of the feedback clock signal 222 beginning at time 322 and ending at the first falling edge of the first Div 4 clock signal 306 at time 323.

The variable skew control block 208 delays the first Div 4 clock signal 306 to generate a second Div 4 clock signal 308, such that the rising edge 332 lines up with the reference clock 212 to rise at time 324. The second Div 4 clock signal 308 is used as a second portion of the feedback clock signal 222 beginning at time 323 and ending at first falling edge of the second Div 4 clock signal 308 at time 325.

The process is repeated again for the next two clock cycles. The variable skew control block 208 then delays the second Div 4 clock signal 308 further to generate a third Div 4 clock signal 310, such that the rising edge 334 lines up with the reference clock 212 to rise at time 326. The third Div 4 clock signal 310 is used as a third portion of the feedback clock signal 222 beginning at time 326 and ending at first falling edge of the third Div 4 clock signal 310 at time 327. This delay operation is repeated at each further clock cycle to synchronize each further portion of the feedback clock signal 222 with the reference clock 212: the variable skew control block 208 delays the Div 4 clock signal to generate a fourth Div 4 clock signal 312, such that the rising edge 336 lines up with the reference clock 212 to rise at time 328, and so on.

Thus, the divided clock is rotated through by introducing progressive delays at the variable skew control block 208. In some embodiments, the variable skew control block 208 has a unit delay small enough that any arbitrary division ratio can be achieved. The operation of delaying the feedback clock signal 222 by a fixed delay results in smaller perturbations to the high-frequency output clock 226, thus resulting in lower output jitter.

Figure 4:
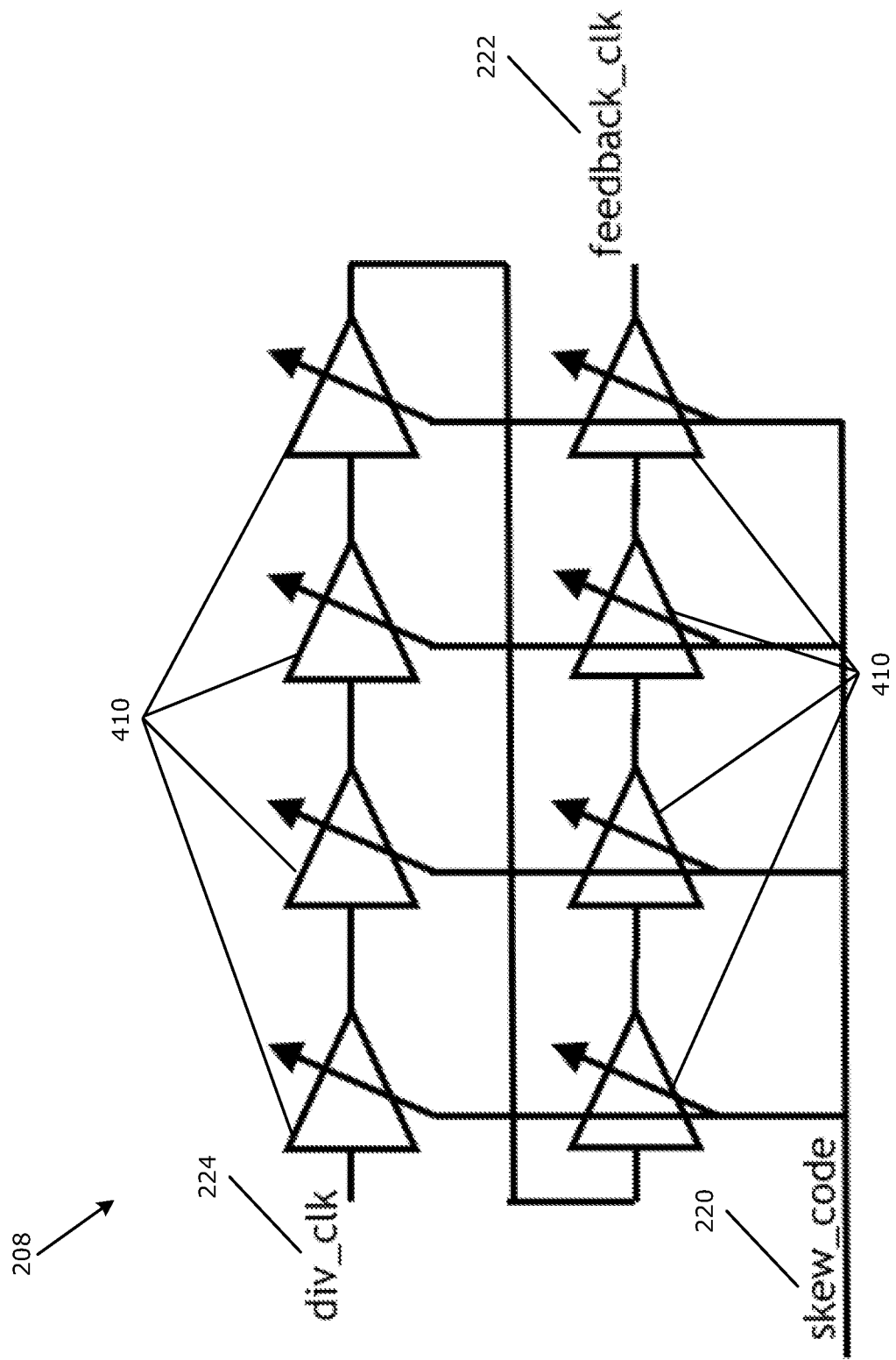
FIG. 4 is a block diagram showing details of the variable skew control block of FIG. 2.

FIG. 4 shows an example variable skew control block 208. The divided clock 224 is received from the clock divider 206 by a first variable delay buffer 410 in a series of multiple variable delay buffers configured in series. Each variable delay buffer 410 receives the skew control signals 220 or a portion thereof (such as one or more bits of a multi-bit digital skew control code included in the skew control signals 220) and applies a corresponding variable amount of delay to the received divided clock 224 to generate the feedback clock 222. Thus, for example, the variable skew control block 208 may first receive a first set of skew control signals 220 that cause the variable delay buffers 410 to collectively apply delay to a Div 4 clock signal received from the clock divider 206 to generate the second Div 4 clock signal 308, then receive another set of skew control signals 220 that cause the variable delay buffers 410 to collectively apply delay to a Div 4 clock signal received from the clock divider 206 to generate the third Div 4 clock signal 310, and so on.

Figure 5:
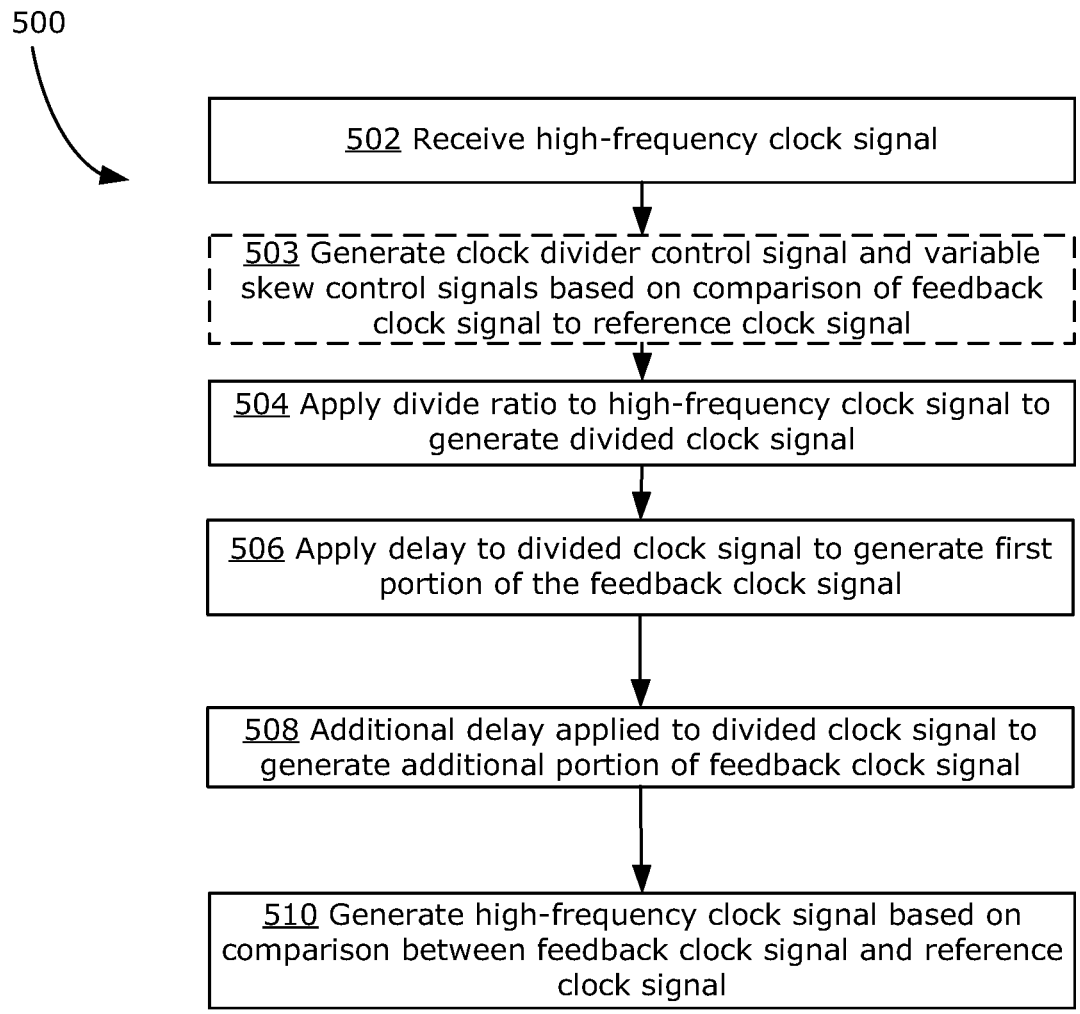
FIG. 5 is a flowchart showing a method for generating a clock signal at a desired frequency.

FIG. 5 shows a method 500 for generating a clock signal at a desired frequency. The method 500 may be performed by a clock generation circuit or device such as circuit 200.

At 502, a high-frequency clock signal is received (e.g. high-frequency output clock 226), the high-frequency clock signal having a frequency equal to the desired frequency multiplied by a frequency multiple (e.g. 4.5).

At 503, optionally, a clock divider control signal and variable skew control signals are generated (e.g. by a clock control unit 202) based on a comparison of a feedback clock signal to a reference clock signal. In some embodiments, the comparison of the feedback clock signal to the reference clock signal comprises measuring a relative phase difference between the feedback clock signal and the reference clock signal.

At 504, a clock divider (e.g. 206) is used to apply a divide ratio to the high-frequency clock signal to generate a divided clock signal, the divide ratio being equal to the frequency multiple rounded up or down to an integer value. In some embodiments, the clock divider may apply the divide ratio in response to receiving a clock divider control signal.

At 506, a variable skew control block (e.g. 208) is used to apply a delay to the divided clock signal to generate a first portion of the feedback clock signal such that an edge of the first portion of the feedback clock is delayed to coincide with a corresponding edge of the high-frequency clock signal divided by the frequency multiple. In some embodiments, the variable skew control block may apply the delay in response to receiving variable skew control signals.

At 508, an additional delay is applied to the divided clock signal to generate an additional portion of the feedback clock signal (e.g. 222) such that an edge of each additional portion of the feedback clock is delayed to coincide with a corresponding edge of the high-frequency clock signal divided by the frequency multiple. Step 508 may be applied one or more times to generate one or more additional portions of the feedback clock signal. In some embodiments, the variable skew control block may apply each additional delay in response to receiving variable skew control signals.

At 510, the high-frequency clock signal is generated based on the comparison (e.g. relative phase difference) between the feedback clock signal and the reference clock signal.

Although the present disclosure describes methods and processes with steps in a certain order, one or more steps of the methods and processes may be omitted or altered as appropriate. One or more steps may take place in an order other than that in which they are described, as appropriate.

Although the present disclosure is described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processing device (e.g., an embedded processor, a personal computer, a server, or a network device) to execute examples of the methods disclosed herein.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. A clock generation circuit for generating a clock signal at a desired frequency based on a high-frequency clock signal, the high-frequency clock signal having a frequency equal to the desired frequency multiplied by a frequency multiple, comprising:
    a clock divider configured to apply a divide ratio to the high-frequency clock signal to generate a divided clock signal, the divide ratio being equal to the frequency multiple rounded up or down to an integer value;
    a variable skew control block configured to:
        apply a delay to the divided clock signal to generate a first portion of a feedback clock signal such that an edge of the first portion of the feedback clock is delayed to coincide with a corresponding edge of the high-frequency clock signal divided by the frequency multiple; and
        repeat one or more times a step of applying an additional delay to the divided clock signal to generate one or more additional portions of the feedback clock signal such that an edge of each additional portion of the feedback clock is delayed to coincide with a corresponding edge of the high-frequency clock signal divided by the frequency multiple.

2. The clock generation circuit of claim 1, wherein the clock divider applies the divide ratio in response to receiving a clock divider control signal.

3. The clock generation circuit of claim 2, wherein the variable skew control block applies the delay and each additional delay in response to receiving variable skew control signals.

4. The clock generation circuit of claim 3, further comprising:
    a phase-locked-loop digital-to-time converter configured to compare the feedback clock signal to a reference clock signal; and
    a clock control unit configured to generate the clock divider control signal and variable skew control signals based on the comparison of the feedback clock signal to the reference clock signal.

5. The clock generation circuit of claim 4, wherein:
the phase-locked-loop digital-to-time converter compares the feedback clock signal to the reference clock signal by measuring a relative phase difference between the feedback clock signal and the reference clock signal; and
the clock control unit is configured to receive the measured relative phase difference from the phase-locked-loop digital-to-time converter.

6. The clock generation circuit of claim 5, further comprising a clock generator block configured to generate the high-frequency clock signal based on the relative phase difference between the feedback clock signal and the reference clock signal.

7. A method for generating a clock signal at a desired frequency, comprising:
receiving a high-frequency clock signal, the high-frequency clock signal having a frequency equal to the desired frequency multiplied by a frequency multiple;
using a clock divider to apply a divide ratio to the high-frequency clock signal to generate a divided clock signal, the divide ratio being equal to the frequency multiple rounded up or down to an integer value;
using a variable skew control block to apply a delay to the divided clock signal to generate a first portion of a feedback clock signal such that an edge of the first portion of the feedback clock is delayed to coincide with a corresponding edge of the high-frequency clock signal divided by the frequency multiple; and
repeating one or more times a step of applying an additional delay to the divided clock signal to generate one or more additional portions of the feedback clock signal such that an edge of each additional portion of the feedback clock is delayed to coincide with a corresponding edge of the high-frequency clock signal divided by the frequency multiple.

8. The method of claim 7, wherein the clock divider applies the divide ratio in response to receiving a clock divider control signal.

9. The method of claim 8, wherein the variable skew control block applies the delay and each additional delay in response to receiving variable skew control signals.

10. The method of claim 9, further comprising generating the clock divider control signal and variable skew control signals based on a comparison of the feedback clock signal to a reference clock signal.

11. The method of claim 10, wherein the comparison of the feedback clock signal to the reference clock signal comprises measuring a relative phase difference between the feedback clock signal and the reference clock signal.

12. The method of claim 11, further comprising generating the high-frequency clock signal based on the relative phase difference between the feedback clock signal and the reference clock signal.

* * * * *